(12) United States Patent
Laufer et al.

(10) Patent No.: US 11,187,989 B2
(45) Date of Patent: Nov. 30, 2021

(54) METHOD FOR DETERMINING PROPERTIES OF AN EUV SOURCE

(71) Applicant: Carl Zeiss SMT GmbH, Oberkochen (DE)

(72) Inventors: Timo Laufer, Stuttgart (DE); Markus Hauf, Ulm (DE); Ulrich Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/824,644

(22) Filed: Mar. 19, 2020

(65) Prior Publication Data
US 2020/0218159 A1 Jul. 9, 2020

Related U.S. Application Data

(63) Continuation of application No. PCT/EP2018/073903, filed on Sep. 5, 2018.

(30) Foreign Application Priority Data

Sep. 28, 2017 (DE) ..................... 10 2017 217 266.5

(51) Int. Cl.
*G03F 7/20* (2006.01)
(52) U.S. Cl.
CPC ............ *G03F 7/702* (2013.01); *G03F 7/7085* (2013.01)
(58) Field of Classification Search
CPC ............... G03F 7/7085; G03F 7/70033; G03F 7/70891; G03F 7/702
See application file for complete search history.

(56) References Cited

U.S. PATENT DOCUMENTS

| | | | |
|---|---|---|---|
| 2004/0227102 A1* | 11/2004 | Kurt | G01N 21/95684 250/491.1 |
| 2006/0222044 A1 | 10/2006 | Melzer et al. | |
| 2008/0017810 A1 | 1/2008 | Frijns | |
| 2008/0212059 A1* | 9/2008 | Warm | G03F 7/70133 355/68 |
| 2008/0258070 A1* | 10/2008 | Scholz | G03F 7/70033 250/372 |
| 2010/0192973 A1 | 8/2010 | Ueno et al. | |

(Continued)

FOREIGN PATENT DOCUMENTS

| | | |
|---|---|---|
| DE | 10 2005 004 460 A1 | 8/2006 |
| DE | 10 2010 062 763 A1 | 6/2013 |
| WO | WO 2014/001071 A2 | 1/2014 |

OTHER PUBLICATIONS

German Office Action, with translation thereof, for corresponding DE Appl No. 10 2017 217 266.5, dated May 2, 2018.

(Continued)

*Primary Examiner* — Deoram Persaud
(74) *Attorney, Agent, or Firm* — Fish & Richardson P.C.

(57) ABSTRACT

The disclosure provides a method for determining at least one property of an EUV source in a projection exposure apparatus for semiconductor lithography, wherein the property is determined on the basis of the electromagnetic radiation emanating from the EUV source, and wherein a thermal load for a component of the projection exposure apparatus is determined and the property is deduced on the basis of the thermal load determined.

20 Claims, 2 Drawing Sheets

(56) References Cited

U.S. PATENT DOCUMENTS

| | | | | |
|---|---|---|---|---|
| 2011/0001947 A1* | 1/2011 | Dinger | ................ | G03F 7/70075 355/67 |
| 2012/0050703 A1* | 3/2012 | Layh | ........................ | G21K 1/06 355/30 |
| 2012/0262688 A1* | 10/2012 | De Vries | ............. | G03F 7/70191 355/67 |
| 2013/0141707 A1* | 6/2013 | Baer | ........................ | G02B 5/00 355/67 |
| 2015/0036115 A1* | 2/2015 | Patra | ........................ | G03F 7/702 355/67 |
| 2016/0334711 A1* | 11/2016 | Eurlings | ................ | H05G 2/005 |
| 2017/0160641 A1* | 6/2017 | Endres | ................ | G03F 7/70075 |
| 2019/0056669 A1* | 2/2019 | Weidman | ............ | G03F 7/70083 |

OTHER PUBLICATIONS

Translation of International Search Report for corresponding Appl No. PCT/EP2018/073903, dated Dec. 10, 2018.

\* cited by examiner

METHOD FOR DETERMINING PROPERTIES OF AN EUV SOURCE

CROSS-REFERENCE TO RELATED APPLICATIONS

The present application is a continuation of, and claims benefit under 35 USC 120 to, in-ternational application PCT/EP2018/073903, filed Sep. 5, 2018, which claims benefit under 35 USC 119 of German Application No. 10 2017 217 266.5, filed Sep. 28, 2017. The entire disclosure of these applications are incorporated by reference herein.

FIELD

The disclosure relates to a method for determining at least one property of an EUV (Extreme Ultraviolet) source in a projection exposure apparatus for semiconductor lithography.

BACKGROUND

For trouble-free operation of an EUV projection exposure apparatus, it is expedient to determine the current properties of the source such as, for example, the power emitted by the latter into the illumination system of the apparatus or the spatial distribution or variation of the power over time, in order, if appropriate, to be able to initiate adjustment, maintenance or repair measures.

It is known to determine properties of the source indirectly from the intensity distribution of the projection light on the wafer plane. However, a multiplicity of optical elements are typically situated in the light path between source and wafer in a projection exposure apparatus, which optical elements likewise influence the intensity distribution in the wafer plane and thus contribute to a corruption of the measured result or make the measurement considerably more difficult overall. Furthermore, production has to be interrupted in order to carry out such a measurement and also for other measurements by which the properties of the EUV source are intended to be determined.

SUMMARY

The present disclosure seeks to specify a method by which operating parameters of an EUV source for semiconductor lithography or the changes therein can be identified more simply and more reliably than has been possible hitherto according to the solutions that are known.

In a general aspect, the disclosure provides a method for determining at least one property of an EUV source in a projection exposure apparatus for semiconductor lithography, wherein the property is determined on the basis of the electromagnetic radiation emanating from the EUV source. A thermal load for a component of the projection exposure apparatus is determined and the property of the source is deduced on the basis of the thermal load determined.

The method according to the disclosure is distinguished by the fact that a thermal load for a component of the projection exposure apparatus is determined and the property of the EUV source is deduced on the basis of the thermal load determined.

In this case, the disclosure is based on the assumption that the thermal load acting on a component is proportional to or at least positively correlated with the intensity of the incident electromagnetic radiation, from which in turn the property of the source that is of interest in each case can be determined.

This indirect determination of the properties of the source on the basis of the action thereof on components of the projection exposure apparatus that are present anyway opens up new possibilities for measuring the source properties. In particular, for this purpose it is possible to use sensor technology which is already present in the system anyway and by which properties such as, for example, the current geometry of the components that are of interest in each case are measured.

In one advantageous variant of the disclosure, the property of the source is a contamination of a collector mirror of the source, the collector mirror serving for aligning the electromagnetic radiation, which is initially generated in a nondirectional manner in the source.

The electromagnetic radiation emitted by the source is generally generated by a high-energy plasma which emits light in the extreme short-wave range being generated in a suspended tin droplet via laser irradiation. However, the emission of the desired electromagnetic radiation from the plasma initially does not take place in a directional manner, but rather in a manner distributed uniformly in all spatial directions. In order to obtain a directional illumination beam of sufficient intensity, the initially nondirectional plasma radiation is aligned via the collector mirror. Such collector mirrors are usually embodied as Wolter mirrors having ellipsoids or paraboloids of revolution nested multiply in one another.

However, the collector mirror is subjected to certain aging processes, which can be brought about in particular by tin particles depositing on the reflective surface of the mirror. Since these deposits occur regionally to different extents, this results in considerable regional reductions in the reflectivity of the mirrors and thus in darkened regions in the illumination field generated by the mirror.

This contamination can advantageously be determined by determining the thermal load across an illuminated surface of a component of the projection exposure apparatus; in particular, the distribution of the contamination can be deduced on the basis of the spatial distribution of the thermal load determined.

This makes use of the fact that the intensity of the electromagnetic radiation incident on a partial region of the component is dependent on the reflectivity of that partial region of the collector mirror from which the respective electromagnetic radiation originates. By virtue of the fact that the reflectivity decreases with increasing contamination of the reflective surface by the tin particles already mentioned above, from a decreasing thermal load in a partial region of the illuminated surface of the component respectively considered it is thus possible to deduce a reduced reflectivity and thus an increased contamination in the corresponding region of the collector mirror. The corresponding region is that region from which originates the electromagnetic radiation that is incident on the respective region of the component.

This procedure is advantageous in particular because it makes it possible to monitor the degree of contamination of the mirrors during operation of the associated projection exposure apparatus, in order, if appropriate, to be able to initiate or carry out countermeasures or maintenance work.

Furthermore, the property can be the change in the average source power over time; the absolute average source power can also be determined in an advantageous manner by the method according to the disclosure.

The thermal load can be determined in particular on the basis of a change in geometry of at least one part of the component. For this purpose, position sensors that are present anyway can advantageously be employed as well, wherein for example the distance or a change in the distance between a position sensor and a sensor target can be determined.

In order to determine the property of the source that is of interest in each case on the basis of the thermal load of the component respectively considered, it is possible to carry out for example a theoretical modeling of the system from the source to the component taking account of, for example, the used materials, geometries and further system parameters relevant for the modeling. Supplementarily or alternatively, it is possible to employ a calibration of the system with a source under controlled source properties or a reference measurement using a new system.

The closer to the source the component considered is situated in the light path, the more directly and more rapidly a change in a property of the source will affect the respective regionally incident intensity and thus the local thermal load. It thus proves to be particularly advantageous if a component arranged in the illumination system, in particular as close as possible to the source, is used for determining the property.

A facet mirror which follows shortly after the source in the light path and which performs a first conditioning of the electromagnetic radiation used for imaging thus constitutes an advantageous choice for the component. Such facet mirrors, in particular the field facet mirror which directly follows the source, include a multiplicity of individual reflective optical elements, so-called mirror facets, which are usually mechanically manipulatable and which are mounted in a defined manner on a typically cooled carrier body and are actuable by way of so-called plungers. The plungers are usually rod-shaped extensions on the side facing away from the reflective surface of the mirror facet. Usually, a sensor system is also present for each facet, and serves for determining current geometric parameters of the mirror facet respectively considered. In particular, position sensors can be present, with which a displacement and/or deformation of components of the mirror facet or of the associated kinematics can be determined.

In this case, by way of example, it is possible to measure a distance between a position sensor and a sensor target arranged at that end of a plunger which faces away from the reflective surface of the mirror facet, for example in the z-direction; this distance is usually referred to as z-gap. In this case, the z-direction should be understood to mean that spatial direction which runs substantially perpendicular to the reflective surface of a field facet mirror or perpendicular to the lateral extent of the carrier body thereof. The sensor target is a reference element on the basis of which the position sensor can determine a parameter such as the z-gap, for example; this can be for example a reflective element for optical measurements.

Thus, if deviations with regard to the z-gap are detected, the deviations occurring relative to a reference state in which all the mirror facets see a defined reference thermal load, it is possible to detect therefrom a change in the distribution of the thermal load for the relevant region, from which, furthermore, for example local contaminations in the collector mirror and also their position as well as other properties of the source can be deduced. Since the z-gap has to be determined if only for determining and regulating the alignment of the mirror facets during operation of the apparatus, the method according to the disclosure, without intervention in the operation of the apparatus, allows changes that occur in the properties of the source such as local contaminations of the collector mirror, for example, to be determined just by evaluation of parameters that are available anyway. Interrupting production for the purpose of the measurement is thus obviated. Furthermore, carrying out the method according to the disclosure necessitates no structural modification whatsoever to the apparatus to be monitored; it suffices to evaluate parameters that are already available anyway.

BRIEF DESCRIPTION OF THE DRAWINGS

The disclosure is explained in greater detail below with reference to the drawings, in which.

DESCRIPTION OF EXEMPLARY EMBODIMENTS

Figure 1:
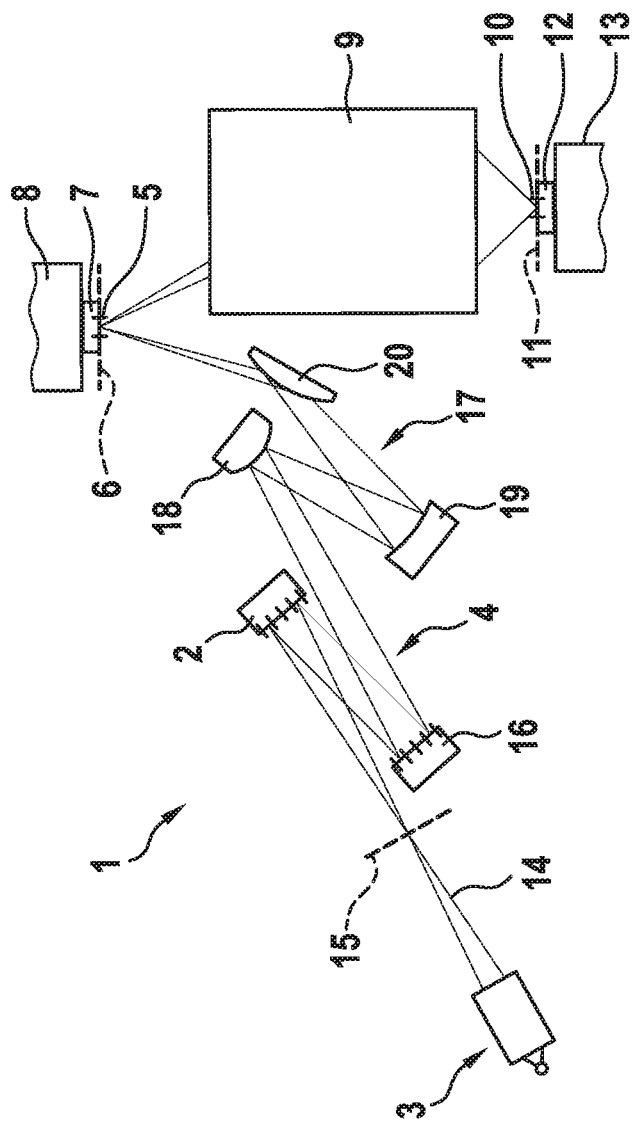
FIG. 1 schematically shows an EUV projection exposure apparatus in which the disclosure can be realized.

FIG. 1 shows by way of example the basic construction of a microlithographic EUV projection exposure apparatus 1 in which the disclosure can find application. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly represented wafer holder 13. The light source 3 can emit used radiation, in particular in a wavelength range of between 5 nm and 30 nm.

Figure 2:
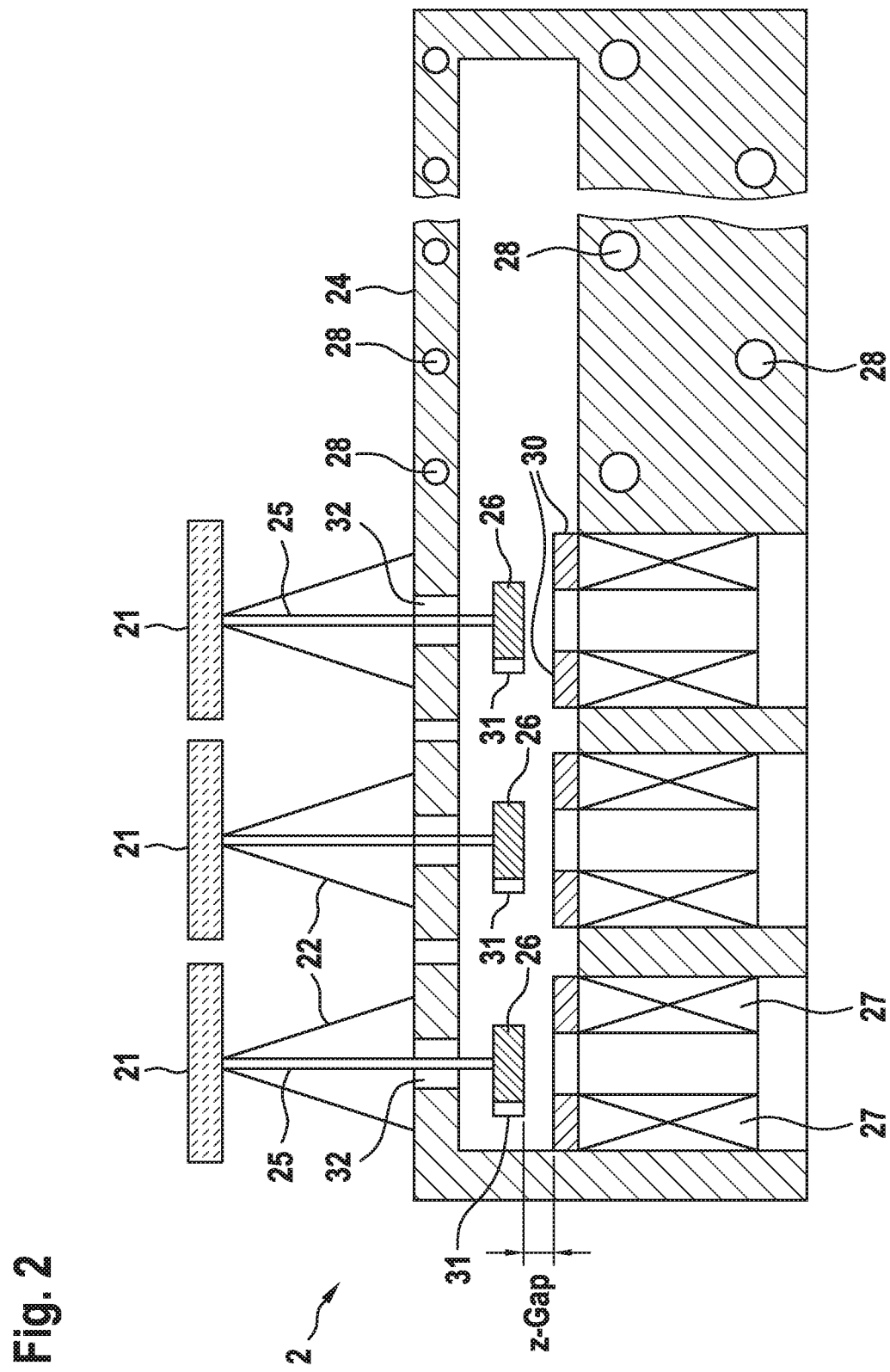
FIG. 2 shows an exemplary field facet mirror on the basis of which the disclosure can be realized.

FIG. 2 shows schematically and by way of example the field facet mirror 2 in which the disclosure can be realized. In an EUV projection exposure apparatus as shown in FIG. 1, the field facet mirror 2 is the first element in the light path of an illumination system for illuminating a reticle 7. Changes in the spatial distribution of the intensity of the light emanating from the light source thus reach the field facet mirror directly, without the addition of effects attributed to the influence of further optical elements in the light path.

The field facet mirror 2 includes a plurality of movable, in particular tiltable, mirror facets 21 arranged movably via kinematics 22, for example flexures, on a carrier body 24, which can be cooled via cooling channels 28. Using the movement or tilting of the mirror facets 21, a specific, case-related intensity distribution, a so-called setting, can be set for the downstream light path. The desired movement can be achieved, as illustrated in the example shown, by a magnetic force being exerted, via electrical actuator coils 27, on a permanent magnet 26 arranged on a rod-shaped extension 25 on the mirror facet 21, the extension also be referred to as a facet plunger. In this case, the actuator coils 27 are arranged in a carrier body 24, which can likewise be cooled via cooling channels 28. The carrier body 24 has a perforation 32 for each facet plunger 25, through which perforation a facet plunger 25 passes.

Non-contact actuation of the mirror facets 21 can be achieved with the arrangement shown. The position sensors 30 are likewise arranged on the carrier body 24 or on the actuator coils 27, with which position sensors it is possible to determine the spatial relationship between the sensor targets 31 thereof and the position sensors 30 and, in particular, also the distance between the position sensors 30 and the sensor targets 31, the so-called sensor gap or z-gap.

The sensor targets 31 can be, as already mentioned, for example mirrors or graticules in the case of the use of optical sensors. The sensor targets 31 here are arranged on the permanent magnets 26 of the facet plungers 25.

In this case, it is advantageous if the sensor makes possible a three-dimensional position measurement. In this case, the value of the z-gap, as a parameter, concomitantly influences the position determination for the mirror facet 21 considered. As is easily discernible from the figure, in the event of a thermally induced change in the length of the plunger 25, the value for the z-gap changes as well. Such a thermally induced change in length can be caused, in particular, by variation of the local distribution of the radiation-induced thermal load among the mirror facets 21. This change can stem in particular from local changes in the reflectivity of the collector mirror and from local contaminations of the mirror—in this case, the value for the z-gap would rise on account of the resultant shortening of the plunger 25. This opens up the possibility of deducing newly occurring local contaminations of the collector mirror or other properties of the source using the position sensors 30 that are already present anyway, with a spatially resolved evaluation of the temporal profile of the z-gap during operation of the system. Furthermore, using the known spatial relationship between individual mirror facets 21 and locations on the reflective surface of the collector mirror, it is also possible to determine where on the collector mirror the contamination has occurred. Typical field facet mirrors contain more than 300 individual mirror facets, and so a high spatial resolution can advantageously be achieved.

LIST OF REFERENCE SIGNS

1 Projection exposure apparatus
2 Field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate focal plane
16 Pupil facet mirror
17 Optical assembly
18, 19, 20 Mirror
21 Mirror facet
22 Kinematics
23 Cooling channel
24 Carrier body
25 Plunger
26 Permanent magnet
27 Coil
28 Cooling channel
30 Position sensor
31 Sensor target
32 Perforation

What is claimed is:

1. A method for determining a contamination of a collector mirror of an EUV source of a semiconductor lithography projection exposure apparatus, the method comprising:
    determining, based on a change in geometry of a facet mirror of an illumination system of the projection exposure apparatus, a thermal load for the facet mirror due to EUV radiation emanating from the EUV source; and
    determining the contamination of the collector mirror based on the determined thermal load for the facet mirror.
2. The method of claim 1, further comprising:
    determining a spatial distribution of the thermal load across a surface of the facet mirror due to the EUV radiation emanating from the EUV source; and
    determining a distribution of the contamination of the collector mirror based on the determined spatial distribution of the thermal load across the surface of the facet mirror.
3. The method of claim 2, wherein the facet mirror comprises a field facet mirror.
4. The method of claim 3, wherein:
    the projection exposure apparatus further comprises a position sensor and a sensor target; and
    the method further comprises determining the change in geometry of the field facet mirror based on a change in a distance between a position sensor and a sensor target.
5. The method of claim 4, further comprising using the projection exposure apparatus in a production operation while determining the thermal load for the field facet mirror due to EUV radiation emanating from the EUV source and determining the contamination of the collector mirror.
6. The method of claim 3, further comprising using the projection exposure apparatus in a production operation while determining the thermal load for the field facet mirror due to EUV radiation emanating from the EUV source and determining the contamination of the collector mirror.
7. The method of claim 1, wherein:
    the projection exposure apparatus further comprises a position sensor and a sensor target; and
    the method further comprises determining the change in geometry of the facet mirror based on a change in a distance between a position sensor and a sensor target.
8. The method of claim 7, wherein the sensor target is supported by a plunger of a facet of the facet mirror.
9. The method of claim 7, wherein the facet mirror comprises a field facet mirror.
10. The method of claim 1, wherein the facet mirror comprises a field facet mirror.
11. The method of claim 1, further comprising using the projection exposure apparatus in a production operation while determining the thermal load for the facet mirror due to EUV radiation emanating from the EUV source and determining the contamination of the collector mirror.

12. The method of claim 11, wherein the facet mirror comprises a field facet mirror.

13. A method for determining a contamination of a component an EUV source of a semiconductor lithography projection exposure apparatus, the method comprising:

determining, based on a change in geometry of a component of an illumination system of the projection exposure apparatus, a thermal load for the component of the illumination system due to EUV radiation emanating from the EUV source; and determining the contamination of the component of the EUV source based on the determined thermal load for the component of the illumination system.

14. The method of claim 13, wherein the component of the EUV source comprises a collector mirror.

15. The method of claim 13, wherein the component of the illumination system comprises a facet mirror.

16. The method of claim 13, wherein the component of the illumination system comprises a field facet mirror.

17. The method of claim 13, further comprising:

determining a spatial distribution of the thermal load across a surface of the component of the illumination system due to the EUV radiation emanating from the EUV source; and determining a distribution of the contamination of the component of the EUV source based on the determined spatial distribution of the thermal load across the surface of the component of the illumination system.

18. The method of claim 13, wherein:

the projection exposure apparatus further comprises a position sensor and a sensor target; and the method further comprises determining the change in geometry of the component of the illumination system based on a change in a distance between a position sensor and a sensor target.

19. The method of claim 18, wherein the sensor target is supported by a plunger of a facet of the facet mirror.

20. The method of claim 13, further comprising using the projection exposure apparatus in a production operation while determining the thermal load for the component of the illumination system due to EUV radiation emanating from the EUV source and determining the contamination of the component of the EUV source.

* * * * *

UNITED STATES PATENT AND TRADEMARK OFFICE
CERTIFICATE OF CORRECTION

PATENT NO. : 11,187,989 B2
APPLICATION NO. : 16/824644
DATED : November 30, 2021
INVENTOR(S) : Laufer et al.

Page 1 of 1

It is certified that error appears in the above-identified patent and that said Letters Patent is hereby corrected as shown below:

In the Specification

Column 1, Line 8, delete "in-ternational" and insert -- international --.

Signed and Sealed this
Twenty-ninth Day of March, 2022

Drew Hirshfeld
*Performing the Functions and Duties of the
Under Secretary of Commerce for Intellectual Property and
Director of the United States Patent and Trademark Office*